United States Patent [19]

Acher et al.

[11] Patent Number: 5,691,645

[45] Date of Patent: Nov. 25, 1997

[54] PROCESS FOR DETERMINING INTRINSIC MAGNETIC PERMEABILITY OF ELONGATED FERROMAGNETIC ELEMENTS AND ELECTROMAGNETIC PROPERTIES OF COMPOSITES USING SUCH ELEMENTS

[75] Inventors: Olivier Acher, Antony; Pierre Marie Jacquart, Roissy-en-Brie; Alfred Schaal, Massy, all of France

[73] Assignee: Commissariat a L'Energie Atomique, France

[21] Appl. No.: 464,606

[22] Filed: Jul. 31, 1995

[30] Foreign Application Priority Data

Dec. 17, 1992 [FR] France .................... 92 15234

[51] Int. Cl.⁶ .................... G01N 27/72; G01R 27/04
[52] U.S. Cl. .................... 324/637; 324/629; 324/234; 324/250; 29/593
[58] Field of Search .................... 324/629, 631, 324/637, 228, 234, 236, 250; 29/593

[56] References Cited

U.S. PATENT DOCUMENTS

| | | |
|---|---|---|
| 3,553,622 | 1/1971 | Subovici et al. . |
| 3,969,668 | 7/1976 | Weinzinger et al. .................... 324/234 |
| 4,465,974 | 8/1984 | Sparks .................... 324/250 X |
| 4,866,371 | 9/1989 | De .................... 324/639 |
| 5,075,630 | 12/1991 | Babbitt et al. .................... 324/629 |

FOREIGN PATENT DOCUMENTS

| | | |
|---|---|---|
| 0299498 | 1/1989 | European Pat. Off. . |
| 2550628 | 2/1985 | France . |
| 2913741 | 10/1980 | Germany . |
| 88-130683 | 4/1988 | Japan . |
| 3286505 | 12/1991 | Japan . |
| WO91/12960 | 9/1991 | WIPO . |

OTHER PUBLICATIONS

"Precise Measurements on Dielectric and Magnetic Materials"; *IEE Transactions on Instruments and Measurements*, vol. IM-23; No. 4; Dec. 1974; pp. 425-431; A.C. Lynch.

"Measurement of the Intrinsic Properties of Materials by Time-Domain Techniques"; A.M. Nicolson et al; IEEE Transactions on Instrumentation and measurements, vol. IM-19, N. 4; pp. 377-382; Nov., 1970.

"Dimensional Correction of High Dielectric and Magnetic Constants Determined by S Parameters Measurements"; J.C. Henaux et al; Jul. 19, 1990, vol. 26, No. 15, Electronics Letters.

"Evolution de la permeablilite haute frequence (jusqu'a 3GHz) de couches minces ferromagnetiques a base de cobalt en fonction de la contrainte"; O. Acher et al; Journal De Physique IV, pp. C3-229-233, Dec. 1992.

*Primary Examiner*—Glenn W. Brown
*Attorney, Agent, or Firm*—Hayes, Soloway, Hennessey, Grossman & Hage, P.C.

[57] ABSTRACT

A process for determining the intrinsic magnetic permeability of elongated ferromagnetic elements and the electromagnetic properties of composites using such elements are disclosed. According to the process, an annular core or torus is produced, which torus is wound with ferromagnetic elements. The core is placed in a coaxial line, the properties of the torus are measured, and permeability of the elements and the properties of an equivalent composite for a given polarization are deduced from such measurement. Particular utility is found in the area of study of composite charges for use at microwave frequencies.

44 Claims, 6 Drawing Sheets

PROCESS FOR DETERMINING INTRINSIC MAGNETIC PERMEABILITY OF ELONGATED FERROMAGNETIC ELEMENTS AND ELECTROMAGNETIC PROPERTIES OF COMPOSITES USING SUCH ELEMENTS

BACKGROUND OF THE INVENTION

1. Field of the Invention

The present invention relates to a process for the determination of the intrinsic magnetic permeability of elongated ferromagnetic elements and a process for determining the electromagnetic properties (magnetic permeability and electrical permittivity) for a particular polarization, of anisotropic composites using such elongated ferromagnetic elements.

The ferromagnetic elements according to the invention are elongated in at least one direction. They can e.g., be thin films, lamellas, fibers, wires, needles, plates, wafers, etc.

The anisotropic composites considered in the present invention are constituted by elongated ferromagnetic elements all oriented in the same direction, the assembly being held in an insulator.

2. Brief Description of Related Prior Art

In a microwave frequency field, use is often made, within a waveguide, of a component required to modify the propagation of the incident wave. This "charge" can e.g. be used for phase shifting, reflecting or absorbing to a greater or lesser extent the wave over a particular frequency range.

FIG. 1 illustrates a rectangular waveguide 8 provided at its end 10 with a charge 12, which can be of many different forms. It can e.g. be a composite product constituted by a stack of magnetic layers, e.g. ferromagnetic layers, and alternating insulating layers.

The electromagnetic field flowing in such a guide, in the illustrated propagation mode, has a vertical electrical component E, i.e. perpendicular to the planes of the layers and a horizontal magnetic component, i.e. in the planes of the layers.

In the case of a propagation in free space, the magnetic field could be directed perpendicular to the layers and the electrical field parallel thereto. The composite would then be reflecting.

FIG. 2 illustrates in a simplified, larger scale manner the structure of the composite in question with its lamellar structure 12 receiving the guided wave 16. The special feature of this composite is that it has ferromagnetic layers oriented parallel to the electromagnetic field propagation direction.

FIG. 3 further defines the conditions for obtaining a better penetration or depth interactions of the wave in the material. The electromagnetic wave must be such that the magnetic field H is in the planes of the layers and the electrical field E perpendicular thereto. The propagation vector K is then directed parallel to the layers and perpendicular to the free surface of the composite.

It is easily possible to adjust the thicknesses of the charges and arrange them so as to adapt them to the sought function (phase shift, reflection, absorption, etc.), once the electromagnetic properties of permittivity and permeability μ of the materials as a function of the frequency are known. However, it is difficult to determine these properties ε and μ for an anisotropic composite like that of FIG. 2. The presently used methods for determining ε and μ of an anisotropic composite are unable to give these quantities over a wide frequency range and require large amounts of materials.

In numerous cases it is possible to predict the permeability of the composite on the basis of the intrinsic permeability of the ferromagnetic materials. However, the intrinsic permeability is also difficult to measure. Among the methods for measuring the magnetic permeability of a material, certain are based on the measurement of the inductance of a coil in which the material to be measured is placed. However, this method is limited at the high frequencies by the resonant frequency of the coil. It is therefore very difficult to exceed 1 GHz with this method. Moreover, the "unloaded" calibration of the coil can be difficult and the edge effects disturbing.

Consideration can also be given to the direct measurement of the permeability by directing an electromagnetic wave onto the material. Such measurements are intended to make it possible to derive to the permeability. However, this method functions very poorly with conductive materials, ferromagnetic materials being conductive. An electromagnetic wave penetrates in such cases over a thickness (called skin thickness), which decreases with the frequency. At frequencies above a few hundred MHz said thickness is very small, namely a few dozen microns or much less. It is then impossible to measure the permeability by reflection or transmission measurements through a solid material, whereas said method functions very well for materials or composites which are slightly or not conductive.

However, it is possible to perform cavity measurements by placing a ferromagnetic material on the wall of a cavity resonator. By measuring the displacement of the resonant frequency of the cavity resonator, it is possible to determine the permeability of the film at this frequency. However, this method suffers from the disadvantage of being monofrequency.

FR-A-2 550 628 describes a process according to which a toroidal, ferrimagnetic material sample is placed in a coaxial line and, with the aid of a measuring loop surrounding said sample, measurements are carried out which, by comparison with a toroidal, non-magnetic material sample, make it possible to determine the permeability of the material.

ELECTRONICS LETTERS, vol. 26, No. 15, Jul. 19, 1990, pp 1151 to 1153 describes a process for measuring dielectric and magnetic constants of a solid material having the form of a thin cylinder surrounding the central conductor of a coaxial line.

IEEE Transactions on Instrumentation and Measurement, vol. IM-23, No. 4, December 1994, pp 425–431 describes methods for measuring transformer cores at very low frequencies.

IEEE Transactions on Instrumentation and Measurement, vol. LM-19, No. 4, November 190, pp 377–382 describes a method for measuring intrinsic properties of certain materials by measurements in the time domain. A sample of the material to be measured is placed in a microwave line and the sample is excited by an electromagnetic pulse with a duration below 1 nanosecond. The transmitted wave and reflected wave are measured and deduction takes place from the shape thereof of the permittivity and permeability of the material.

The article by C. A. GRIMES et al published in IEEE Trans. Magnetics, 24 (1), 1988, p 603 explains the frequency limitations of permeability measuring methods for ferromagnetic materials particularly in the case of a thin anisotropic layer, which has a permeability which differs in orthogonal directions.

In the article by H. KOYAMA et al entitled "Permeability of CoNbZr amorphous thin films over a wide frequency range" published in IEEE TRanslation Journal of Magnetics in Japan, vol. TJMJ-2, No. 9, September 1987, it is disclosed that two different arrangements are necessary for performing the measurement between 1 MHz and 1.6 GHz.

The object of the present invention is to obviate all these disadvantages. It permits the determination of the intrinsic magnetic permeability of elongated ferromagnetic elements (thin films, fibers, needles, wafers, etc.) over a wide frequency range from 0.016 to above 206 Hz with the aid of a conventional microwave measuring procedure. It also permits the determination of the electromagnetic properties of anisotropic insulator-ferromagnetic composites where the ferromagnetic part is constituted by elongated ferromagnetic elements (thin films, fibers, needles, wafers, etc.), which are insulated from one another by an insulator and oriented in one direction. The process of the invention makes it possible to obtain the magnetic permeability or electrical permeability sought over a wide frequency range from approximately 0.01 GHz (10 MHz) to above 20 GHz with the aid of a standard microwave measuring procedure.

SUMMARY OF THE INVENTION

In order to achieve these objectives, according to the invention the ferromagnetic elements are firstly wound in the form of an annular core or torus, and they are coated with an electrical insulating material, said elements being elongated in a tangential direction in said torus. The torus is then placed in a coaxial line belonging to a measuring bench or means.

However, it is known that in a coaxial line the fundamental electromagnetic mode which propagates is such that the electrical field is radial and the magnetic field tangential. Therefore in the line the magnetic field will be directed into the ferromagnetic layers of the torus and the electrical field will be perpendicular to these layers. This configuration of the fields is precisely that which corresponds to the mode able to penetrate the material (cf. FIG. 3). At the same time it permits the performance of conventional microwave measurements in reflection and transmission in the coaxial line. These measurements can be performed with the aid of a conventional network analyzer. This would give the magnetic permeability $\mu m$ for a microwave magnetic field in the direction of the layers and the electrical permittivity $em$ for an electrical field perpendicular to said layers. These permeability and permittivity values make it possible to predict the behavior of the composite for a wave, whose polarization is that indicated in FIGS. 1 or 3 or 11.

Having measured the magnetic permeability of the torus and taking account of the ferromagnetic material fraction contained in said torus, it is possible to deduce the intrinsic magnetic permeability from the ferromagnetic elements used. Thus, it is known in general terms that when the permeability of a laminated or stratified composite is known, the value of the intrinsic permeability of the ferromagnetic material forming it can be raised. Research on this subject has been published, in particular by S. M. RYTOV in "Electromagnetic properties of a finely stratified medium" published in Soviet Physics JETP, vol. 2, No. 3, May 1956, pp 466–475. If the thickness of the ferromagnetic material is relatively low compared with the skin thickness at the considered frequency, the permeability of the ferromagnetic $\mu f$ is linked with the measured permeability for the composite, i.e. $\mu m$, by the relation:

$$\mu f = 1 + (\mu m - 1)/F$$

in which F is the ferromagnetic material charge rate (this is true because the permeability of the matrix is 1).

If the thickness of the ferromagnetic layer is no longer negligible compared with the skin thickness, the relation is more complex and becomes:

$$\mu m = [(1-F) + F \cdot C \mu f]/[1 + F(C-1)]$$

with $$C = \frac{tg(\pi N fef/>)}{\pi N fef/>}$$

in which F designates the ferromagnetic charge rate and > the wavelength, ef the thickness of the ferromagnetic layer, Nf the index of the ferromagnetic material (equal to the square root of the product of the electrical permittivity and the permeability at the considered frequency). It is possible to numerically solve this relation in order to find $\mu f$ as a function of the measured permeability $\mu m$.

Thus, these or more complex formulas will be applied (cf. LANDAU and LIFGHITZ, Physique Theorique, vol. 8, MIR volume, second edition, 1990) in order to derive to the intrinsic permittivity or permeability of the ferromagnetic material.

When the ferromagnetic elements whose permeability is to be determined are films, the torus can be formed in the following way:

the starting item is an electrically insulating film,
this insulating film is covered with a thin layer of ferromagnetic material,
the thus covered insulating support is cut in order to form a tape,
this tape and is wound onto itself.

It would also be possible to start with a ferromagnetic tape (such as those produced by rolling or wheel coating), which has optionally undergone a thickness reduction by a chemical process. The insulator will be a varnish, a glue, an adhesive, a flexible film or a combination thereof. If the thickness of the ferromagnetic layer exceeds 10 μm, it would be advantageous to reduce its thickness, e.g. by chemical etching, in order to have a better measuring accuracy.

However, the invention is not limited to the case of thin layers or films and can also be performed with ferromagnetic fibers or wires. In this case, in order to form the torus, a ferromagnetic wire will be wound onto a core and the assembly will be coated with an insulating material. For constituting the ferromagnetic wire, it is possible to start with an insulating wire onto which is deposited a ferromagnetic material.

It would also be possible to use a solid ferromagnetic film, optionally sheathed with an insulating varnish.

When the ferromagnetic elements are plates, wafers or needles, the torus could be formed in the following way:

a layer of limited thickness (typically 20 μm to 2 mm) of a ferromagnetic mixture and binder is produced, in which the ferromagnetic elements are oriented, said orientation e.g. being brought about by applying a matched magnetic field, and
tapes are cut from said layer in appropriate directions and are wound in order to obtain a torus, a glue or adhesive being optionally added.

This requires the layer of ferromagnetic and binder to be relatively flexible for the winding operation. Thus, use is made of a binder which remains flexible after setting, or the tapes are cut and wound prior to the complete setting of the binder. It is advantageous to minimize the thickness of the adhesive joints, which essentially have a disadvantageous influence on the measurement of ε. The relative error in the determination of ε is approximately:

$$\frac{\epsilon_{measured} - \epsilon_{composite}}{\epsilon_{composite}} = g \times \left(1 - \frac{\epsilon_{measured}}{\epsilon_{adhesive}}\right)$$

in which g is the resin addition or adhesive volume fraction.

For measuring composites with a high ε (close to or beyond 10), it may be advantageous to use as the adhesive or resin for the winding operation, an adhesive or resin with a permittivity ε equal to or above 10, in order to limit errors.

For example, it is possible to mix elongated ferromagnetic needles with a resin (e.g. Rhône-Poulenc brand RTV141) with a 10% volume rate cast a plate of approximate thickness 0.3 mm, orient the needles under a fixed magnetic field of 300 Oe for 30 minutes, set the resin by passing into an oven at 120° C. for 4 h and then cut strips in the direction of the needles. The proposed binder remains flexible, so that said strips can be wound into a toroidal shape.

Use is made of the resin RTV141 for carrying out adhesion, or preferably resin RTV141 filled with the same ferromagnetic elements at the same charge rate.

The torus is machined to the dimensions of the coaxial line and the measurements are performed according to standard coaxial line procedures.

DETAILED DESCRIPTION OF EMBODIMENTS

Figure 4:
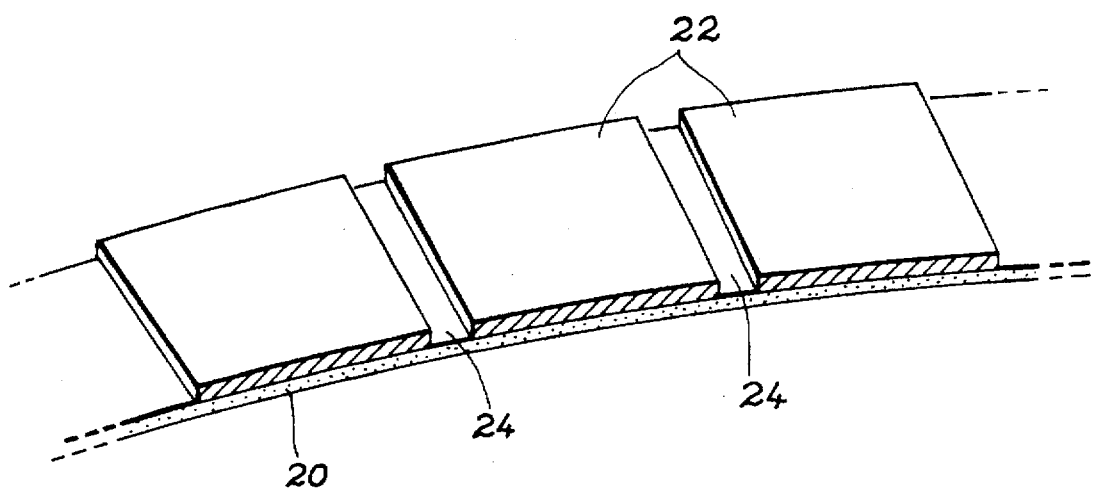
FIG. 4 shows an insulating tape covered with an interrupted ferromagnetic layer.
Figure 5:
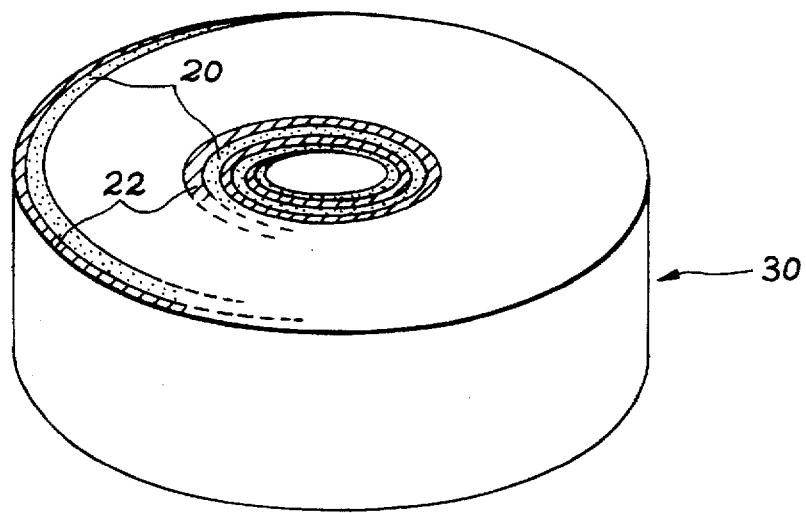
FIG. 5 shows a torus obtained by winding the tape of FIG. 4.

When the ferromagnetic elements are thin layers, it is possible to proceed according to FIGS. 4 and 5 for forming the annular core or torus to be used for the coaxial line measurement.

The starting product is an e.g. Mylar (registered trademark) insulating film 20, which is covered with a thin ferromagnetic layer 22, e.g. of CoNiZrMo using any appropriate means. This film is cut to obtain a tape. It is also possible to start with a support-free ferromagnetic, thin tape or sheet, e.g. produced by wheel coating or rolling and which has optionally undergone a thickness reduction by chemical etching or the like. The insulator can be a flexible film, but also a varnish or simply the adhesive or glue used for solidifying the coil.

Figure 1:
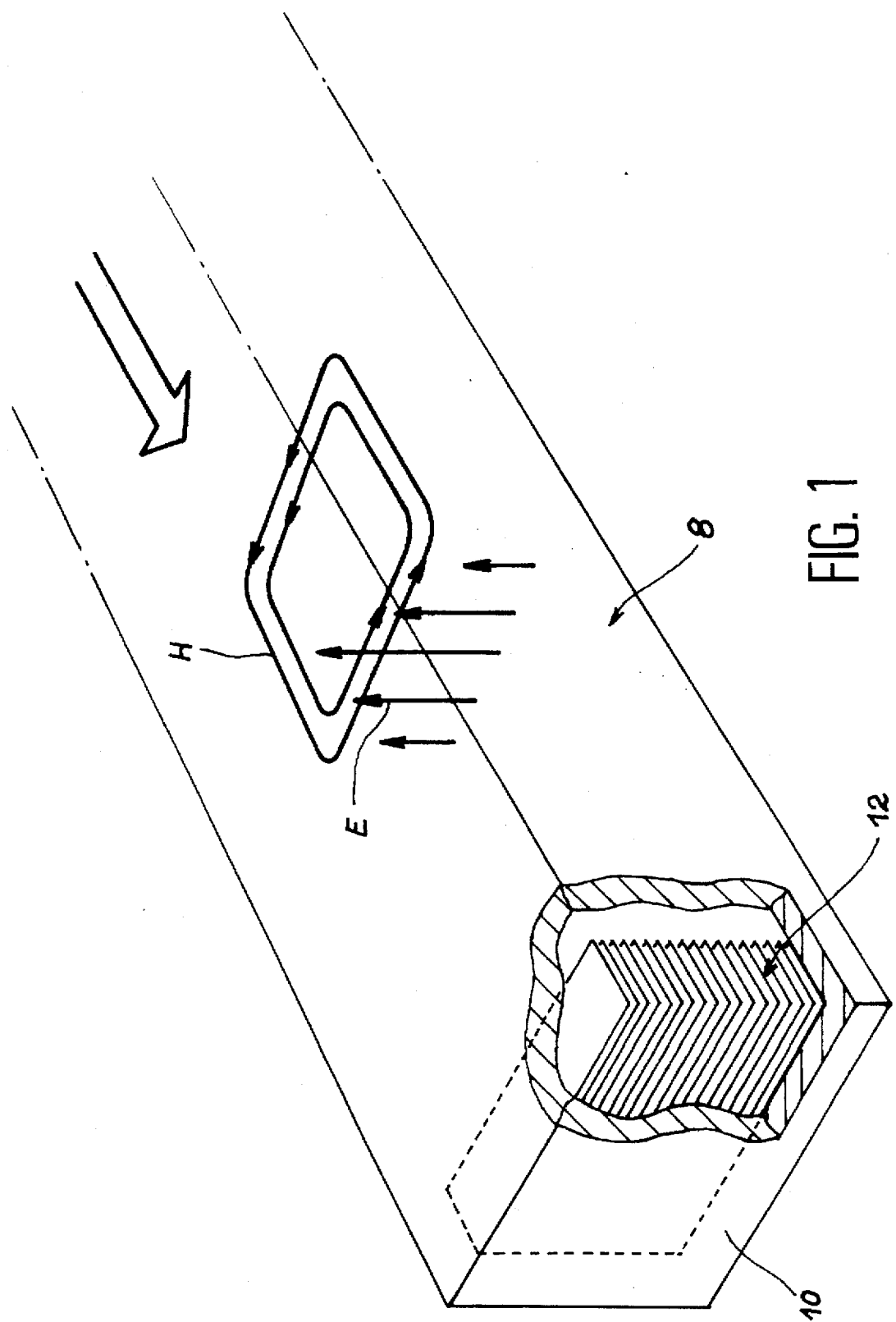
FIG. 1, already described, shows a composite material located in a rectangular waveguide.
Figure 2:
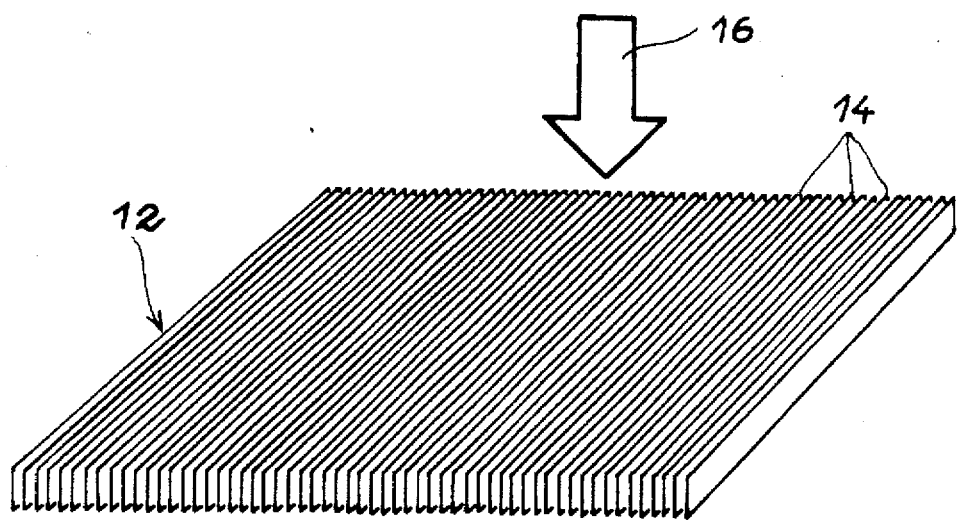
FIG. 2, already described, shows the structure of the composite.
Figure 3:
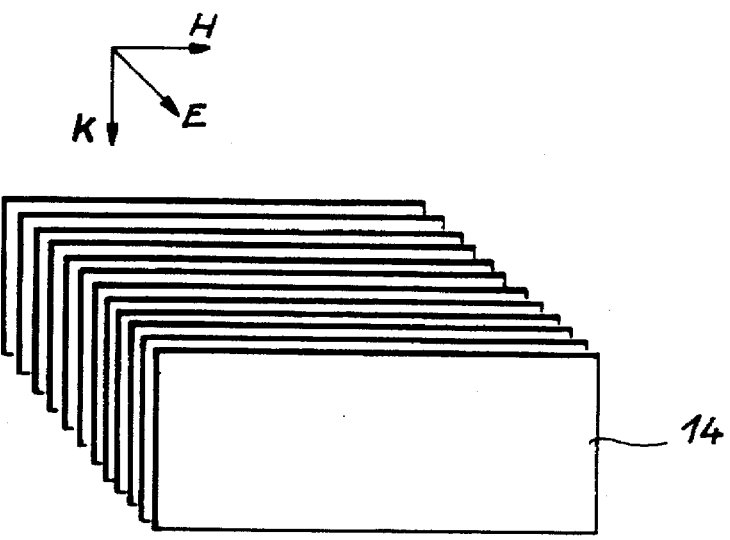
FIG. 3, already described, diagrammatically shows a composite and indicates the direction of the electrical and magnetic fields for obtaining a good penetration of the wave in the composite.

On merely winding the tape with its ferromagnetic layer, a torus would be obtained with a spirally wound, continuous ferromagnetic layer. The torus would not then be precisely equivalent (for the electromagnetic field propagating in the coaxial line) to the lamellar composite of FIGS. 2 and 3. In order to avoid this cause of error and obtain a torus whose permeability measured in the coaxial line is correctly linked with the intrinsic permeability without losing the advantage of the coiled geometry, it is possible to produce electrical discontinuities in the ferromagnetic tape. These discontinuities are designated 24 in FIG. 4. They can be directly obtained during the deposition of the ferromagnetic layer by masking or, after deposition, by etching the ferromagnetic material. It would also be possible to stretch the flexible film so as to crack the deposit.

There is no need for the discontinuities to be regular. It is preferable for the continuity lengths to be relatively small. It should be ensured that the distance between two discontinuities remains well above the thickness of the layer.

Electrical discontinuities are not necessary, all the less so when the ferromagnetic tape is thin and not very conductive and when the frequencies at which the measurement is performed are high. Typically, if the thickness of the ferromagnetic is 0.4 μm and the conductivity 135 μΩcm., the measurement is very good as from 500 MHz, even without discontinuities.

The tape of FIG. 4 is then wound onto a mandrel. In order to guarantee the good mechanical strength of the assembly, it is possible to add a material such as an adhesive, resin or varnish.

This gives a torus as illustrated in FIG. 5, where it is designated 30. It is to be ensured that the insulating layer 20 and the ferromagnetic layer 22 occupy a tangential position (as indicated, these layers are not strictly tangential because they form a spiral and not concentric circles, but this geometrical displacement with respect to the ideal situation has no practical consequence).

Figure 6:
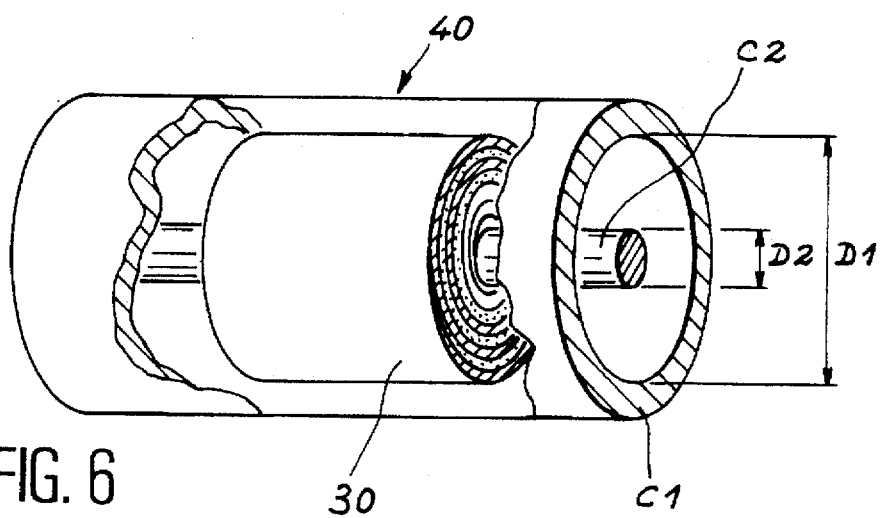
FIG. 6 diagrammatically shows a coaxial line into which has been introduced the torus of FIG. 5.

The thus formed torus 30 is then placed in a coaxial line 40, as illustrated in FIG. 6. This line is formed by an external conductor C1 (with an internal diameter D1) and an internal conductor C2 (with an external diameter D2).

Figure 7:
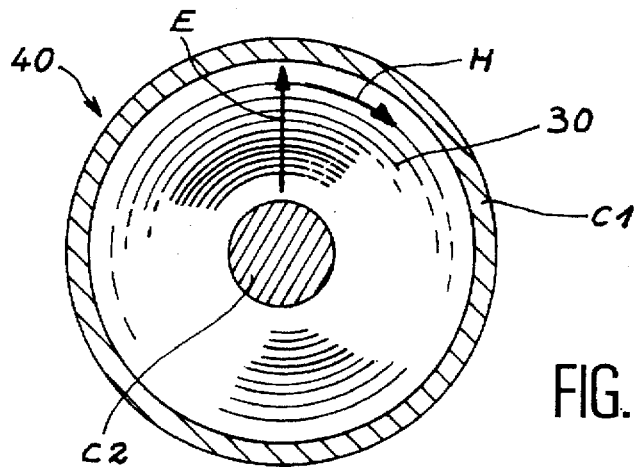
FIG. 7 shows the electrical and magnetic field lines in the torus.

FIG. 7 shows in section the torus 30 in the coaxial line 40 and makes it possible to see that the magnetic field lines H of the wave flowing in the coaxial line (TEM wave) are indeed located in the ferromagnetic layers, whereas the electrical field lines E are perpendicular to said layers.

Figure 8:
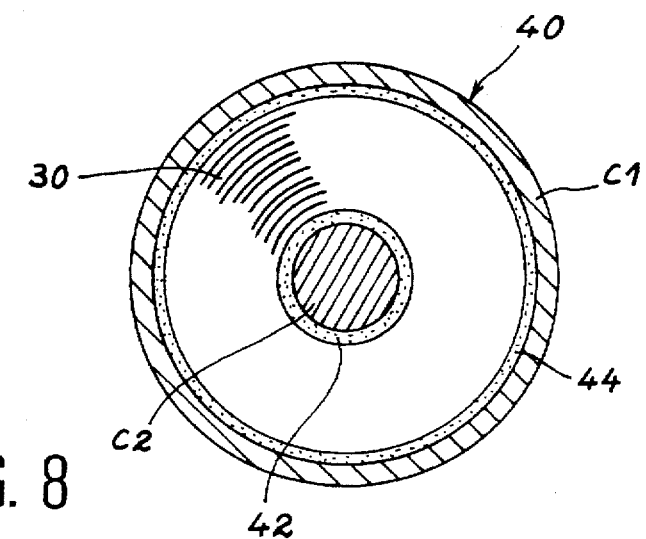
FIG. 8 shows a variant of the torus with a dielectric coil and collar.

If it is wished to recover the tape, winding can take place around a coil which is centrally recessed over a diameter D2 and made from a dielectric material, until a diameter slightly smaller or equal to the diameter D1 of the external conductor of the coaxial line is reached. The free end of the tape can be maintained either by adhesion, or by locking in a dielectric collar, or by using a mechanical device made from an electrical material, whose diameter will reach the diameter D1 of the external conductor. This is shown in FIG. 8, where it is possible to see a recessed coil 42 and a locking collar 44.

If the thickness of the coil 42 is very small compared with the quotient of the vacuum wavelength (at the operating frequency) divided by the index of the material at said frequency and if the diameter variation between the coaxial line and the exterior of the ferromagnetic torus is small compared with the wavelength (optionally divided by the index of the locking collar), it is then possible to perform the measurements in the manner indicated hereinbefore, provided that F is no longer defined as the ferromagnetic material volume fraction, but as the linear ferromagnetic fraction in the portion of the radius from the internal conductor of the coaxial line to its external conductor.

The process of the invention is also applicable to the case where the ferromagnetic material films have an easy magnetization axis and a difficult magnetization axis. In this case, after depositing the ferromagnetic material film on the insulating film, the assembly will be cut parallel to one of said magnetization axes in order to form the tape.

It is also possible to use the ferromagnetic layers or films in the presence of a continuous magnetic field. In this case, the coaxial line measurement will also take place in the presence of a magnetic field. These fields can e.g. be obtained with the aid of permanent magnets or conductive windings.

An exemplory performance of the process according to the invention will now be described. A 0.4 µm thick CoNiZrMo layer is deposited on a 12 µm thick Mylar (registered trademark) flexible film. By means of the KERR effect the easy and difficult magnetization directions will be determined. A 3 mm wide tape having a length of a few dozen centimeters is cut. This tape is wound around an axis with the aid of an Araldite (registered trademark) adhesive in order to obtain a rigid torus. By machining said torus is brought to the necessary dimensions for the passage into the coaxial measuring line, ensuring that short-circuits are not induced on the faces. The ferromagnetic material charge rate is determined, either directly if the adhesive thickness is known, or by density measurement, or by magnetization measurement. In the considered embodiment, this rate is 3%.

Figure 9:
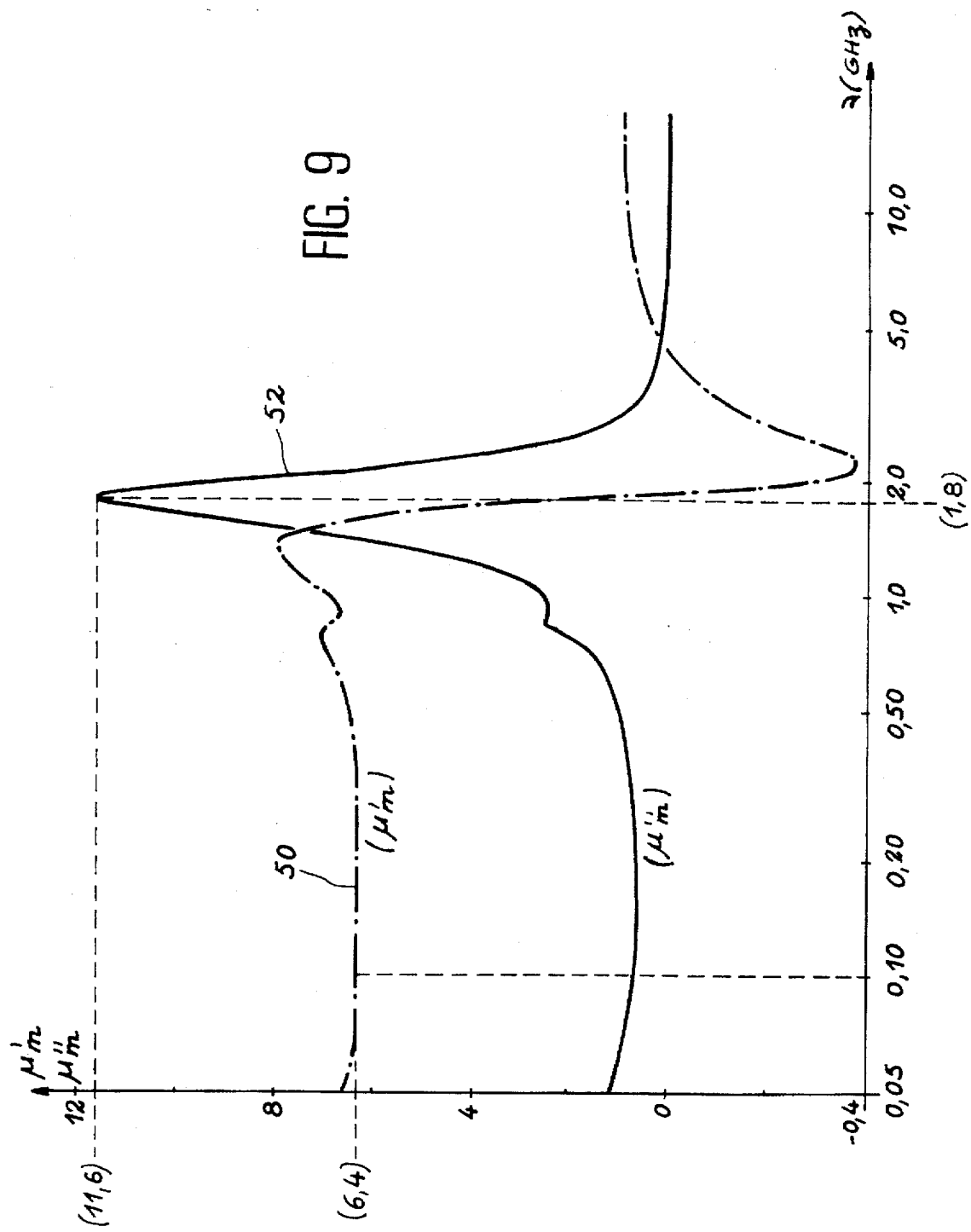
FIG. 9 shows the results of a composite magnetic permeability measurement.

Measurement takes place of the two components of the magnetic permeability, i.e. µ' (real component) and µ" (imaginary component) using an "HP 8510 Network Analyser" type of HEWLETT PACKARD measurement bench. The results of FIG. 9 are obtained, where curve 50 corresponds to the component µ' and the curve 52 to component µ". On the abscissa is plotted the measuring frequency > from 0.05 to 18 GHz.

As the ferromagnetic layer is much thinner than the skin thickness at the considered frequencies, it is possible to apply the simplest of the formulas given hereinbefore, namely:

$$\mu f = 1 + (\mu m - 1)/F$$

with F=0.03.

At a frequency of 100 MHz (also in a range from 100 to 500 MHz), the graph of FIG. 9 gives the value 6.4 for µ'm. The part µ'f of the ferromagnetic is therefore 1+(6.4−1)/0.03, i.e. approximately 180. At its maximum (obtained for 1.8 GHz) the component µ"m is 11.6, so that a component µ"f of the ferromagnetic equal to 11.6/0.03 is approximately 390.

The microwave measuring bench gives access not only to the magnetic permeability, but also the electrical permittivity of the composite for one electrical field direction.

The process of the invention is not limited to the case where the ferromagnetic elements are thin layers, but is also applicable to wires, ferromagnetic fibers, wafers or needles.

Figure 10:
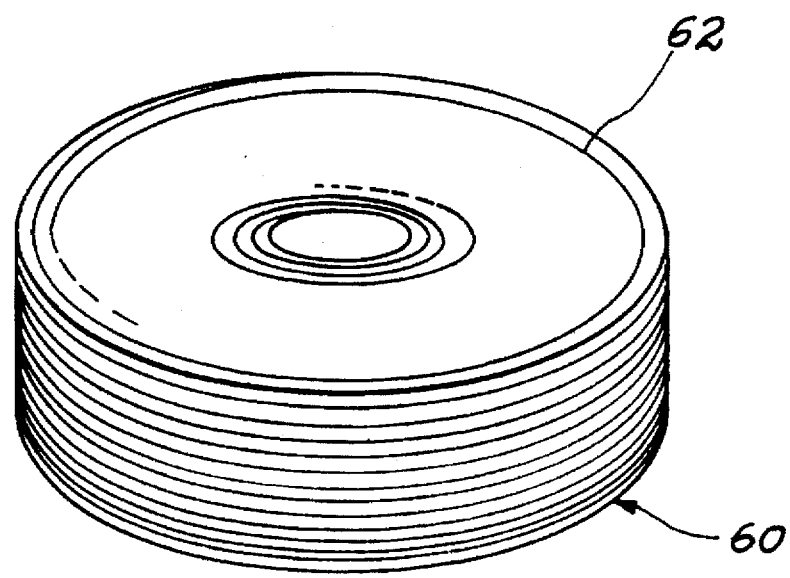
FIG. 10 illustrates another embodiment of the invention in the case of ferromagnetic fibers.

In this case the first stage of the process consists of winding the ferromagnetic wire in order to form a torus, as illustrated under the general reference 60 in FIG. 10, where the wire is 62. The wire is advantageously embedded in an insulating material such as a resin or adhesive (case of wafers or needles).

The wire can be ferromagnetic per se, or can be obtained by depositing a ferromagnetic layer on an insulating wire. In this case and as for the thin layer, the ferromagnetic coating of the wire is preferably interrupted at places and is not continuous, so that the permeability calculation as accurately as possible corresponds to the aforementioned model of the composite.

Figure 11:
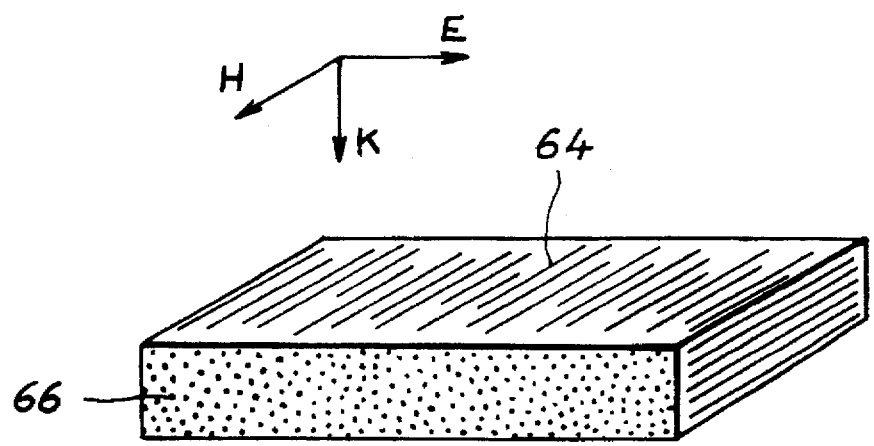
FIG. 11 shows the general path of an anisotropic composite based on ferromagnetic fibers.

In the case of fibers, the composite has the configuration illustrated in FIG. 11. The ferromagnetic fibers 64 are elongated in an insulator 66. The fibers are all elongated in the same direction. The torus of FIG. 10 makes it possible to know the properties of the material of FIG. 11, for the polarization of the wave shown in FIG. 11 (obviously in the case where the wire, the insulator and the charge rate are the same for the materials of FIGS. 10 and 11).

We claim:

1. A process for determining intrinsic magnetic permeability of ferromagnetic elements having an elongated shape in at least one direction, comprising:

winding the ferromagnetic elements to form a torus, said ferromagnetic elements being coated with an electrically insulating material, said ferromagnetic elements being longitudinally disposed in the torus in a substantially tangential direction relative to the torus, placing said torus in a coaxial line of a magnetic permeability measuring means for facilitating measurement of magnetic permeability (µm) of said torus, measuring magnetic permeability (µm) of the torus using said measuring means, and from the magnetic permeability (µm) measured and ferromagnetic material fraction (F) determined to be contained in the torus deducing the intrinsic magnetic permeability (µf) of said ferromagnetic elements.

2. A process according to claim 1, in which the ferromagnetic elements whose magnetic permeability is to be determined comprise thin layers, and wherein:

providing an electrically insulating film, cutting said insulating film with a thin ferromagnetic material layer to produce a covered insulating support, covering the covered insulating support to form a tape, and winding said tape onto itself.

3. A process according to claim 2, wherein during the winding of the tape, an adhesive is added.

4. A process according to claim 2, wherein space in the ferromagnetic layer is formed at time of depositing said layer on the insulating film by masking an area of the film.

5. A process according to claim 2, wherein prior to the winding of the tape, cuts are made in the ferromagnetic layer.

6. A process according to claim 4, wherein the cuts in the ferromagnetic layer are formed after deposition of said ferromagnetic layer on the insulating film, by etching the ferromagnetic layer.

7. A process according to claim 4, wherein the cuts in the ferromagnetic layer are formed after depositing said ferromagnetic layer, and by stretching the insulating film until the ferromagnetic layer splits.

8. A process according to claim 2, in which the thin ferromagnetic material layers have two magnetization axes, and wherein after depositing the thin ferromagnetic material layer on the insulating film, the covered insulating support is cut parallel to one of said magnetization axes in order to form the tape.

9. A process according to claim 2, wherein during the winding of the tape, a resin is added.

10. A process according to claim 2, wherein during the winding of the tape, varnish is added.

11. A process according to claim 1, in which the ferromagnetic elements whose magnetic permeability is to be determined are thin layers, and wherein the torus is formed from a ferromagnetic tape covered with an insulator and wound onto itself.

12. A process according to claim 1, in which the ferromagnetic elements whose magnetic permeability is to be measured are wafers, and wherein the torus is formed by:

mixing said ferromagnetic elements with a binder to form a mixture, forming a layer of limited thickness of said mixture, cutting a tape from said layer, and winding said tape.

13. A process according to claim 12, wherein said ferromagnetic elements are oriented relative to each other in the layer by applying a matched magnetic field to the layer.

14. A process according to claim 12, wherein said binder remains flexible after setting.

15. A process according to claim 12, wherein adhesive is added to said tape during winding of said tape.

16. A process according to claim 1, wherein the magnetic permeability of the ferromagnetic element ($\mu f$) from the measured permeability ($\mu m$) of the torus is determined by the relation:

$$\mu f = 1 + (\mu m - 1)/F$$

in which F is charge rate of the ferromagnetic material torus.

17. A process according to claim 1, in which the ferromagnetic elements whose magnetic permeability is to be determined comprise ferromagnetic wires, and wherein the torus is formed from a ferromagnetic wire wound onto a core and coated with an insulating material.

18. A process according to claim 17, wherein the ferromagnetic wire is formed from an insulating wire on which is deposited a ferromagnetic material.

19. A process according to claim 1, in which the coaxial line is constituted by an external conductor and an internal conductor, said external conductor having an internal diameter which is greater than the external diameter of the internal conductor, and wherein said torus has an external diameter that is slightly smaller than the internal diameter of the external conductor and said torus also has an internal diameter that slightly exceeds the external diameter of the internal conductor, the torus being wound onto a dielectric coil, which is recessed in its center and placed between the internal conductor of the coaxial line (40) and the torus and is introduced into a dielectric collar fitted between the torus and the external conductor of the coaxial line.

20. A process according to claim 1, in which the ferromagnetic elements whose magnetic permeability is to be measured are needles, and wherein the torus is formed by:

mixing said ferromagnetic elements with a binder to form a mixture, forming a layer of limited thickness of said mixture, cutting a tape from said layer, and winding said tape.

21. A process according to claim 20, wherein said ferromagnetic elements are oriented relative to each other in the layer by applying a matched magnetic field to the layer.

22. A process according to claim 20, wherein use is made of a binder which remains flexible after setting.

23. A process according to claim 20, wherein resin is added to said tape during winding of said tape.

24. A process for determining electromagnetic properties of permeability and permittivity for a given polarization of a composite comprising ferromagnetic elements having an elongated shape in at least one direction and an electrical insulator, all said ferromagnetic elements being oriented in an orientation direction in the composite, said process comprising:

winding the ferromagnetic elements to form a torus, said ferromagnetic elements being coated with said electrical insulator, ferromagnetic element charge rate in the torus being equal to composite charge rate, said elements being longitudinally disposed in the torus in a substantially tangential direction relative to the torus, placing said torus in a coaxial line of a magnetic permeability ($\mu m$) measuring means, determining the magnetic permeability ($\mu m$) and the electrical permittivity ($\epsilon m$) of the torus in the coaxial line using said measuring means, said magnetic permeability ($\mu m$) and electrical permittivity ($\epsilon m$) of the torus corresponding to said electromagnetic properties of the composite for a polarization corresponding to the electromagnetic conditions of the torus in the coaxial line.

25. A process according to claim 24, in which the ferromagnetic elements constituting the composite are wafers, and wherein the torus is formed by:

mixing said ferromagnetic elements with a binder to form a mixture, forming a layer of limited thickness of said mixture, cutting a tape from said layer, and winding said tape.

26. A process according to claim 25, wherein the ferromagnetic elements are oriented relative to each other in the layer by applying a matched magnetic field to the layer.

27. A process according to claim 25, wherein said binder, remains flexible after setting.

28. A process according to claim 25, wherein adhesive is added during winding of said tape.

29. A process according to claim 28, wherein the adhesive has a permittivity close to or above 10.

30. A process according to claim 24, in which the ferromagnetic elements of the composite are thin layers, and wherein the torus is formed by:

providing an electrically insulating film, covering said insulating film with a thin ferromagnetic material layer to form a covered insulating support, cutting the covered insulating support to form a tape, and winding said tape onto itself.

31. A process according to claim 30, wherein during the winding of the tape, an adhesive is added.

32. A process according to claim 30, wherein space is formed in the ferromagnetic layer at time of depositing said ferromagnetic layer on the insulating film, by masking an area of the film.

33. A process according to claim 30, wherein prior to the winding of the tape, cuts are formed in the ferromagnetic layer.

34. A process according to claim 33, wherein the cuts in the ferromagnetic layer are formed after deposition of said ferromagnetic layer on the insulating film by etching the ferromagnetic layer.

35. A process according to claim 33, wherein the cuts in the ferromagnetic layer are formed after depositing said ferromagnetic layer, by stretching the insulating film until the ferromagnetic layer splits.

36. A process according to claim 24, in which the ferromagnetic elements constituting the composite comprise ferromagnetic wires, and wherein the torus is formed by winding a ferromagnetic wire onto a core to form an assembly, and coating the assembly with an insulating material.

37. A process according to claim 24, in which the coaxial line is constituted by an external conductor and an internal conductor, said external conductor having an internal diameter which is greater than the external diameter of the internal conductor, wherein said torus (30) has an external diameter that is slightly smaller than the internal diameter of the external conductor and said torus also has an internal diameter that slightly exceeds the external diameter of the internal conductor, the torus (30) being wound onto a dielectric coil, which is recessed in its center and placed between the internal conductor of the coaxial line and the torus and is introduced into a dielectric collar fitted between the torus and the external conductor of the coaxial line.

38. A process according to claim 24, in which the ferromagnetic elements constituting the composite are needles, and wherein the torus is formed by:

mixing said ferromagnetic elements with a binder to form a mixture, forming a layer of limited thickness of said mixture, cutting a tape from said layer, and winding said tape.

39. A process according to claim 38, wherein the ferromagnetic elements are oriented relative to each other in the layer by applying a matched magnetic field to the layer.

40. A process according to claim 38, wherein said binder remains flexible after setting.

41. A process according to claim 38, wherein adhesive is added during winding of said tape.

42. A process according to claim 41, wherein said adhesive has a permittivity close to or above 10.

43. A process according to claim 38, wherein resin is added during winding of said tape.

44. A process according to claim 43, wherein said resin has a permittivity close to or above 10.

* * * * *

UNITED STATES PATENT AND TRADEMARK OFFICE
CERTIFICATE OF CORRECTION

PATENT NO. : 5,691,645
DATED : November 25, 1997
INVENTOR(S) : Olivier Acher, Pierre Marie Jacquart and Alfred Schaal It is certified that error appears in the above-identified patent and that said Letters Patent is hereby corrected as shown below:

Claim 2, Col. 8, line 38, insert --torus is formed by-- after "wherein".

Claim 2, Col. 8, line 42, "cutting" should be --covering--.

Claim 2, Col. 8, line 44, "covering" should be --cutting--.

Claim 6, Col. 8, line 55, delete "," (comma).

Claim 16, Col. 9, line 25, insert --intrinsic-- before "magnetic".

Claim 19, Col. 9, line 51, delete "(40)".

Claim 37, Col. 11, lines 11 and 15, delete "(30)"

Signed and Sealed this

Twenty-second Day of September, 1998

Attest:

BRUCE LEHMAN

Attesting Officer     Commissioner of Patents and Trademarks